US 9,867,297 B2

(12) United States Patent
Suzuki et al.

(10) Patent No.: US 9,867,297 B2
(45) Date of Patent: Jan. 9, 2018

(54) STORAGE DEVICE (71) Applicant: Toshiba Memory Corporation, Minato-ku (JP)

(72) Inventors: Akitoshi Suzuki, Kawasaki (JP); Yoshiharu Matsuda, Kawasaki (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/049,224

(22) Filed: Feb. 22, 2016

(65) Prior Publication Data

US 2017/0188473 A1    Jun. 29, 2017

Related U.S. Application Data

(60) Provisional application No. 62/271,694, filed on Dec. 28, 2015.

(51) Int. Cl.
*H05K 5/00* (2006.01)
*H05K 7/20* (2006.01)

(52) U.S. Cl.
CPC ......... *H05K 5/0043* (2013.01); *H05K 7/2039* (2013.01)

(58) Field of Classification Search
CPC ...... H05K 7/142; H05K 7/205; H05K 5/0043; H05K 7/2039; H05K 2201/10159; H05K 2201/10515; H05K 2201/10522; H05K 3/326; G06F 13/4068; G06F 1/1667; G06F 1/187; G06F 1/184; G06F 1/181; G11B 33/124

USPC ............ 361/679.31–679.39, 724–727; 312/223.1–223.2
See application file for complete search history.

(56) References Cited

U.S. PATENT DOCUMENTS

| 8,665,601 B1* | 3/2014 | Mangay-Ayam, Jr. .. G11C 5/04 361/728 |
|---|---|---|
| 2007/0252283 A1 | 11/2007 | Keller |
| 2013/0214406 A1* | 8/2013 | Schultz ................ H01L 23/46 257/713 |

FOREIGN PATENT DOCUMENTS

| JP | 11-68353 | 3/1999 |
| JP | 2001-339186 | 12/2001 |
| JP | 4753375 | 8/2011 |

* cited by examiner

*Primary Examiner* — Timothy Thompson
*Assistant Examiner* — Ingrid Wright
(74) *Attorney, Agent, or Firm* — Oblon, McClelland, Maier & Neustadt, L.L.P.

(57) ABSTRACT

According to one embodiment, a storage device includes an enclosure, and a circuit board assembly in the enclosure. The circuit board assembly includes a first circuit board, a second circuit board opposed to the first circuit board, a third circuit board opposed to the second circuit board, a first connector connecting the first and second circuit boards to each other, a second connector connecting the second and third circuit boards to each other, and is offset to the first connector in a plane direction, a first spacer between the first and second circuit boards, and a second spacer between the second and third circuit boards. The first spacer includes a support body at a position opposed to the second connector and in contact with the first and second circuit boards.

11 Claims, 7 Drawing Sheets

STORAGE DEVICE

CROSS-REFERENCE TO RELATED APPLICATIONS

This application claims the benefit of U.S. Provisional Application No. 62/271,694, filed Dec. 28, 2015, the entire contents of which are incorporated herein by reference.

FIELD

Embodiments described herein relate generally to a storage device.

BACKGROUND

Currently, magnetic disk devices, solid-state storage drives (SSDs) and the like are used as storage devices. An SSD comprises, for example, stacked circuit boards and an enclosure accommodating these circuit boards. Memory devices such as NAND flash memories are mounted on each circuit board. Adjacent circuit boards are connected to each other via a connector.

In a structure in which three or more circuit boards are stacked, if a connector which connects the second circuit board to the third is offset in a plane direction of the circuit boards with respect to a connector which connects the first circuit board to the second, the circuit boards may tilt or bend while the connectors are mated, causing a mating error or connection error of the connectors.

DETAILED DESCRIPTION

Various embodiments will be described hereinafter with reference to the accompanying drawings. In general, according to one embodiment, a storage device comprises an enclosure and a circuit board assembly accommodated in the enclosure. The circuit board assembly comprises a first circuit board on which a memory device is mounted, a second circuit board on which a memory device is mounted, disposed to oppose the first circuit board, a third circuit board on which a memory device is mounted, disposed to oppose the second circuit board, a first connector provided between the first circuit board and the second circuit board to connect the first circuit board and the second circuit board to each other, a second connector provided between the second circuit board and the third circuit board to connect the second circuit board and the third circuit board to each other, the second connector being offset in a plane direction of the second circuit board with respect to the first connector, a frame-shaped first spacer interposed between the first circuit board and the second circuit board, a frame-shaped second spacer interposed between the second circuit board and the third circuit board, and the first spacer comprises a support body provided at a position opposing the second connector and brought into contact with the first circuit board and the second circuit board.

Hereafter, as a storage device, a solid-state storage drive (SSD) according to an embodiment will be described in detail.

First Embodiment

Figure 1:
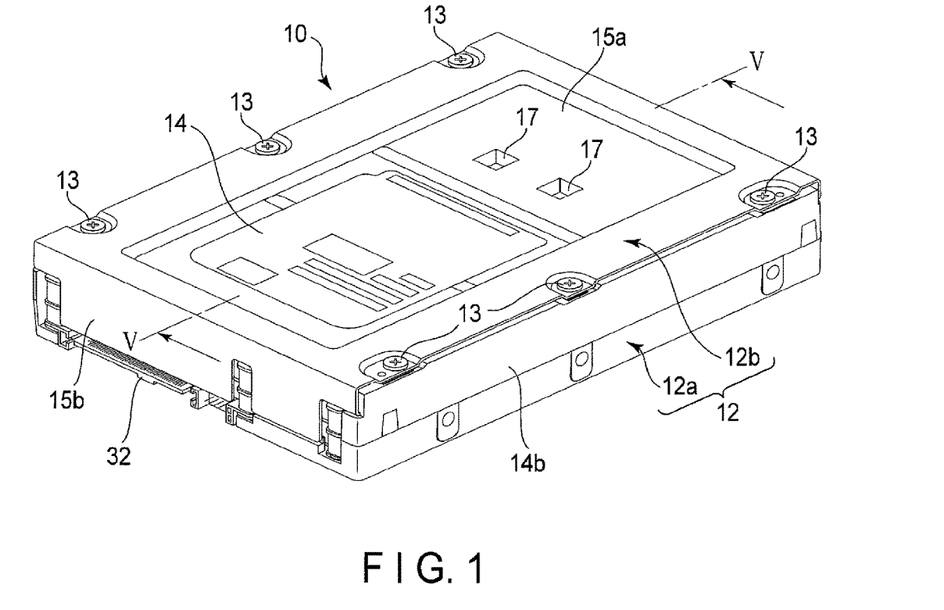
FIG. 1 is a perspective view showing an appearance of a storage device of a first embodiment.
Figure 2:
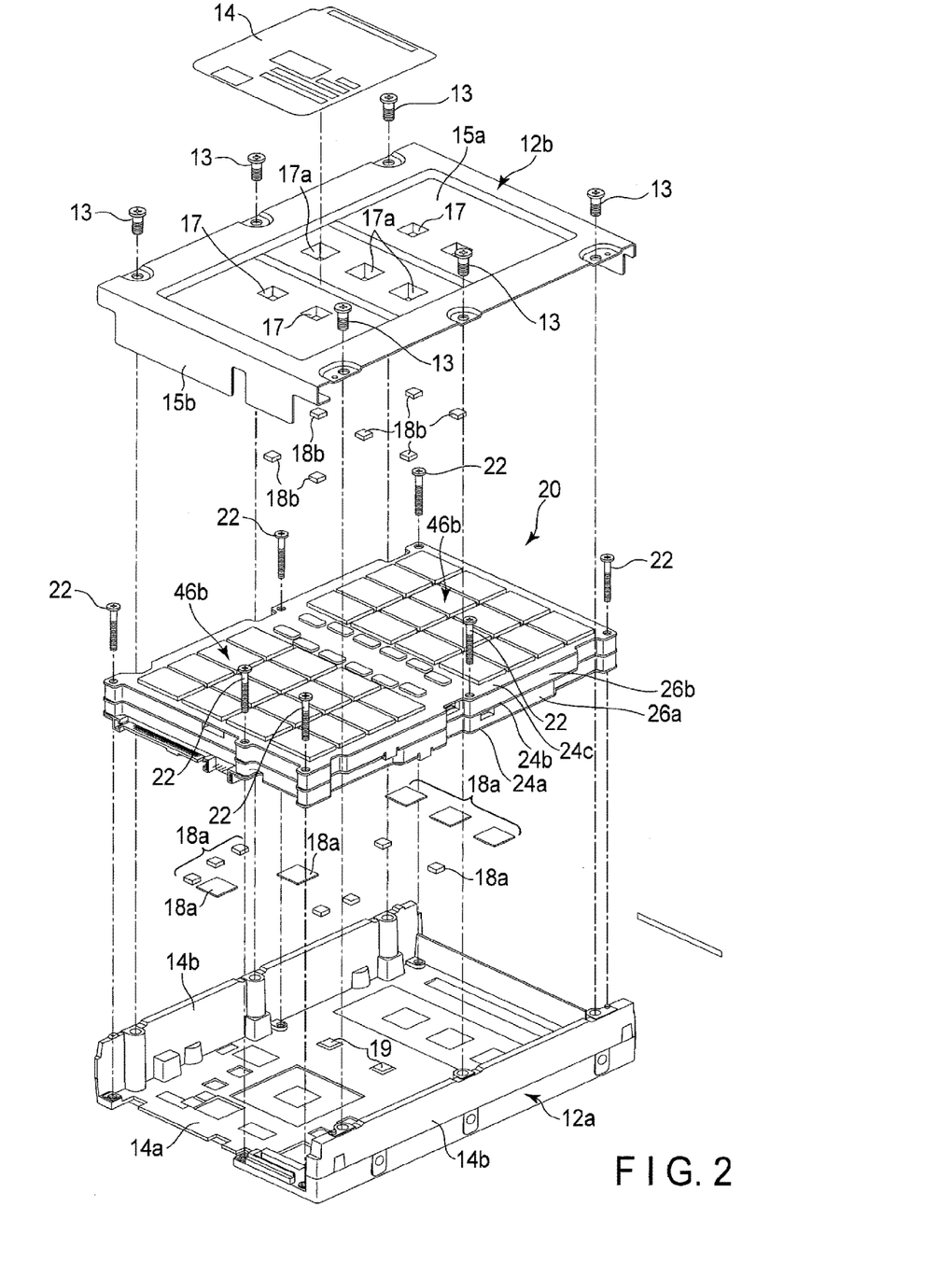
FIG. 2 is an exploded perspective view of the storage device.
Figure 3:
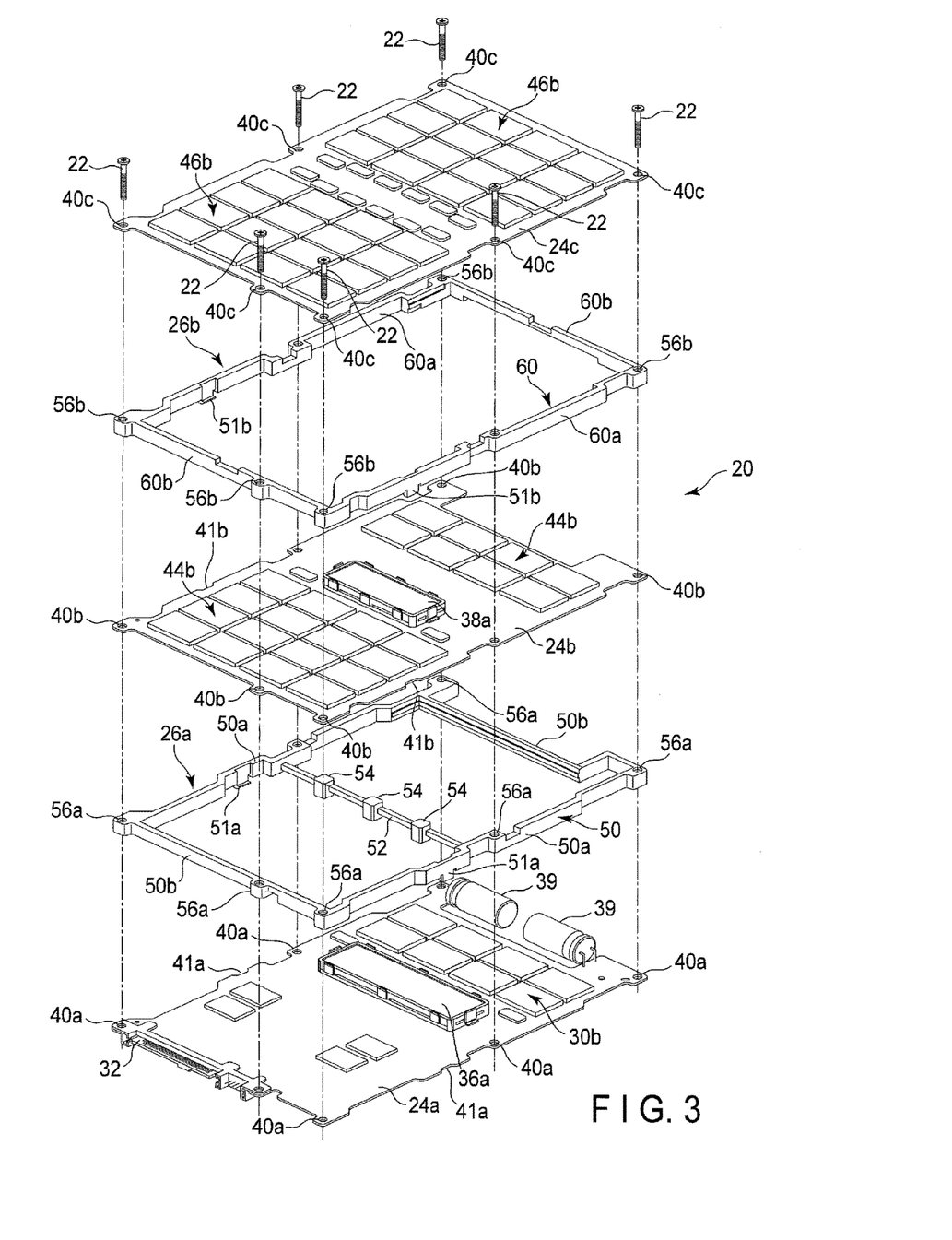
FIG. 3 is an exploded perspective view of a circuit board assembly of the storage device.
Figure 4:
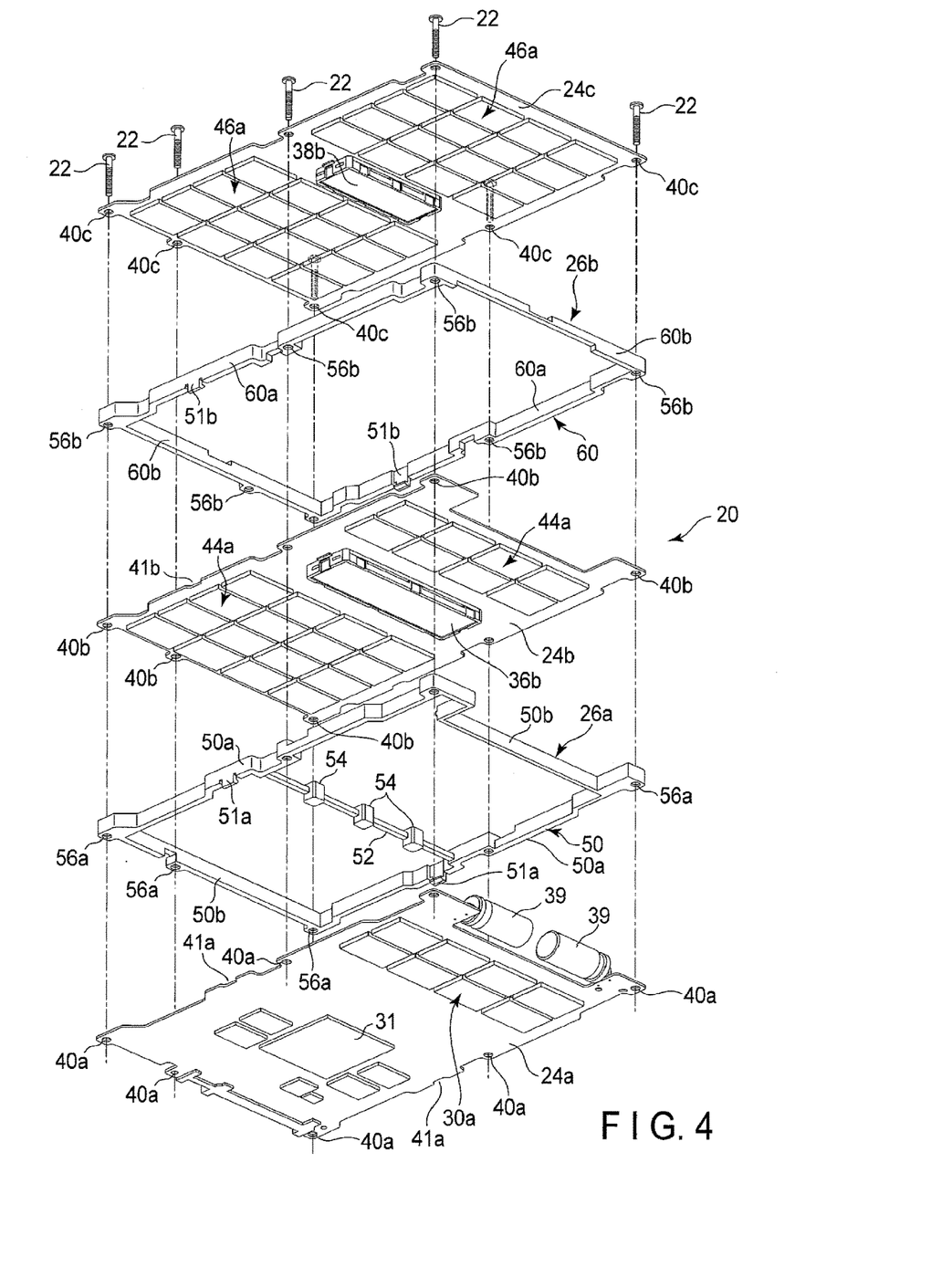
FIG. 4 is an exploded perspective view showing the circuit board assembly from the lower surface side.
Figure 5:
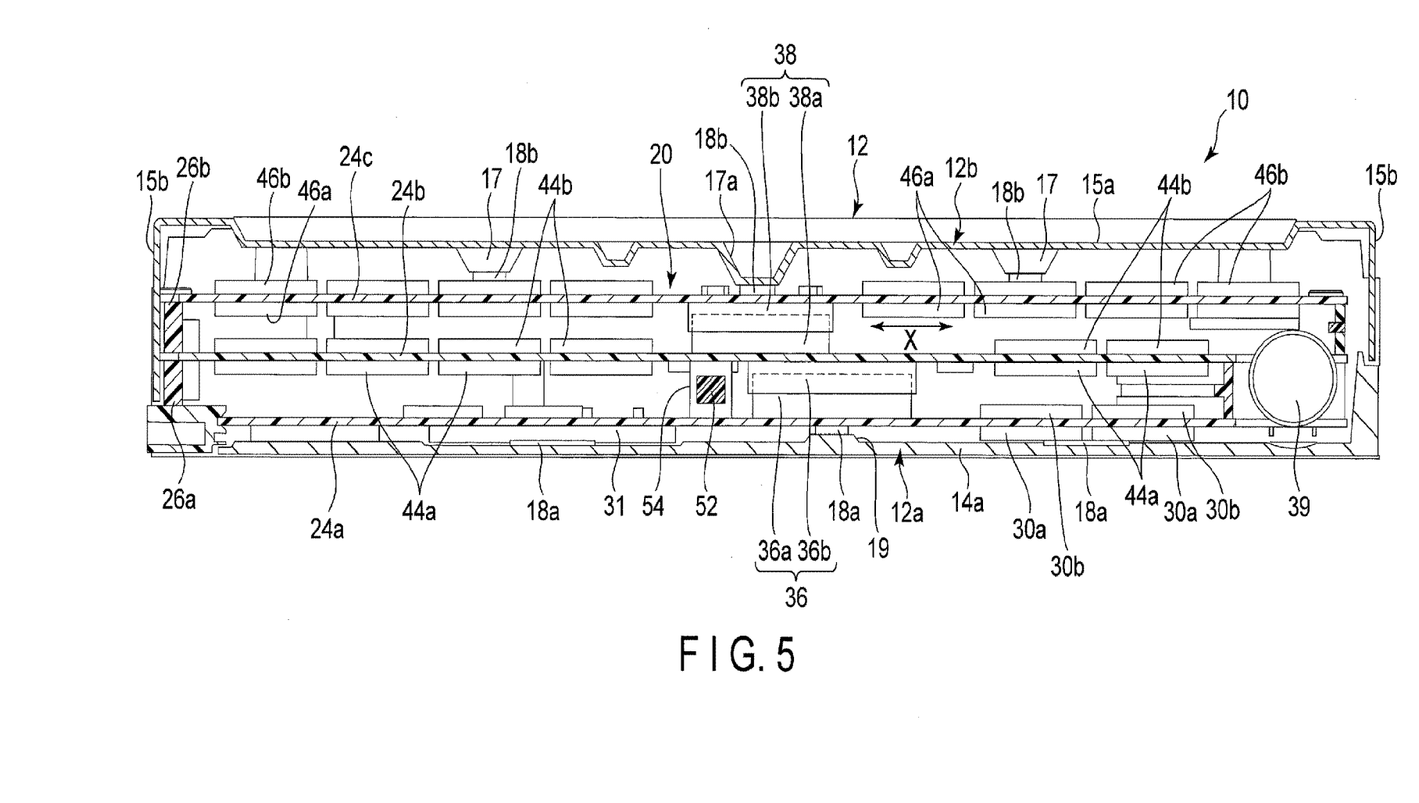
FIG. 5 is a cross-sectional view of the storage device taken along line V-V of FIG. 1.

FIG. 1 is a perspective view showing an appearance of an SSD of the first embodiment. FIG. 2 is an exploded perspective view of the SSD. FIG. 3 is an exploded perspective view of a circuit board assembly of the SSD. FIG. 4 is an exploded perspective view showing the circuit board assembly from the lower surface side. FIG. 5 is a cross-sectional view of the SSD taken along line V-V of FIG. 1.

As shown in FIG. 1, FIG. 2 and FIG. 5, an SSD 10 comprises an enclosure 12 having the shape of a rectangular box and a circuit board assembly 20 accommodated in the enclosure 12. The enclosure 12 comprises a rectangular base 12a formed of aluminum, etc., and a cover 12b fixed to the base 12a. The base 12a integrally comprises a rectangular bottom wall (first wall) 14a and a pair of long-side walls 14b provided along the long sides of the bottom wall 14a. Screw holes for fixing the cover 12b are formed on the top end of each long-side wall 14b. Screw holes for fixing the circuit board assembly 20 are formed at both side edges of the bottom wall 14a. Several (for example, two) projections (bosses) 19 are formed in the central portion of the bottom wall 14a. The bosses 19 are located in a position opposed to a first connector 36 of the circuit board assembly 20 to be described later. Heat-sink pads or heat-sink sheets 18a having thermal transfer and cushioning characteristics are attached to the bosses 19 and several points on the inner surface of the bottom wall 14a. When the circuit board assembly 20 is accommodated in the enclosure 12, the heat-sink sheets 18a are elastically in contact with the circuit board assembly 20.

The cover 12b integrally comprises a rectangular top plate (second wall) 15a and a pair of side plates 15b provided along the short sides of the top plate 15a. The cover 12b is put on to cover the base 12a and fixed to the base 12a by suitable fastenings, for example, six screws 13. A label 14 is attached to the top plate 15a. Recesses (projections) 17 protruding toward the base 12a side are provided on the top plate 15a. On the inner surface side of the top plate 15a, a heat-sink pad or heat-sink sheet 18b having thermal transfer and cushioning characteristics is attached to the bottom of each recess 17. When the circuit board assembly 20 is accommodated in the enclosure 12, the heat-sink sheets 18b are elastically in contact with the circuit board assembly 20. For example, three of the recesses 17, that is, recesses 17a, are located in a position opposed to a second connector 38 of the circuit board assembly 20 to be described later.

As shown in FIG. 2 to FIG. 5, the circuit board assembly 20 comprises several, for example, three stacked circuit boards 24a, 24b and 24c, a first spacer 26a and a second spacer 26b sandwiched between the circuit boards and a first connector 36 and a second connector 38 electrically connecting the circuit boards, which are assembled into a stack structure. More specifically, the circuit board assembly 20 comprises a rectangular first circuit board 24a formed of a rigid printed circuit board, a rectangular second circuit board 24b located above and opposed to the first circuit board 24a and a rectangular third circuit board 24c located above and opposed to the second circuit board 24b. The first to third circuit boards 24a, 24b and 24c have approximately the same external dimensions.

NAND flash memories 30a serving as memory devices, a CPU 31 serving as a controller and other semiconductor devices are mounted on a lower surface (first principal surface) of the first circuit board 24a. An interface connector 32 is mounted on one longitudinal end of the first circuit board 24a. NAND flash memories 30b serving as memory devices and other semiconductor devices are mounted on an upper surface (second principal surface) of the first circuit board 24a. A first-board-side first connector (stacking connector or board-to-board connector) 36a constituting the first connector 36 is mounted substantially in the center of the upper surface of the first circuit board 24a.

The first-board-side first connector 36a has an elongated rectangular shape and is located such that the longitudinal direction thereof corresponds to the width direction of the first circuit board 24a. Two capacitors 39 are mounted on the other longitudinal end of the first circuit board 24a. Through-holes 40a for inserting screws 22 are formed on the peripheral edge of the first circuit board 24a. Notches 41a engageable with tabs of the first spacer 26a are formed on the long-side edge portions of the first circuit board 24a.

The second circuit board 24b is located with the lower surface (first principal surface) opposed to the upper surface of the first circuit board 24a. NAND flash memories 44a serving as memory devices are mounted on the lower surface of the second circuit board 24b. A second-board-side first connector (stacking connector or board-to-board connector) 36b constituting the first connector 36 is mounted substantially in the central portion of the lower surface of the second circuit board 24b. The second-board-side first connector 36b has an elongated rectangular shape and is located such that the longitudinal direction thereof corresponds to the width direction of the second circuit board 24b. In addition, the second-board-side first connector 36b is located in a position opposed to the first-board-side first connector 36a of the first circuit board 24a. Accordingly, when the second circuit board 24b is put on the first circuit board 24a, the second-board-side first connector 36b is engaged with the first-board-side first connector 36a to form the first connector 36.

NAND flash memories 44b serving as memory devices and other semiconductor devices are mounted on an upper surface (second principal surface) of the second circuit board 24b. A second-board-side second connector (stacking connector or board-to-board connector) 38a constituting the second connector 38 is mounted substantially in the central portion of the upper surface of the second circuit board 24b. The second-board-side second connector 38a has an elongated rectangular shape and is located such that the longitudinal direction thereof corresponds to the width direction of the second circuit board 24b. The second-board-side second connector 38a is deviated, i.e., offset relative to the second-board-side first connector 36b constituting the first connector 36 in a surface direction (X-direction) of the second circuit board 24b. The offset can be arbitrarily set, for example, such that about half the width of the second-board-side second connector 38a overlaps the second-board-side first connector 36b. Since the second-board-side first connector 36b and the second-board-side second connector 38a provided on the lower surface and the upper surface of the second circuit board 24b are offset relative to each other, flexibility in connection between the connectors 36b and 38a and interconnects on the second circuit board 24b can be improved and the interconnects can be easily routed and connected.

Through-holes 40b for inserting the screws 22 are formed on the peripheral edge of the second circuit board 24b. Notches 41b engageable with tabs of the second spacer 26b are formed on the long-side edge portions of the second circuit board 24b.

The third circuit board 24c is located with the lower surface (first principal surface) opposed to the upper surface of the second circuit board 24b. NAND flash memories 46a serving as memory devices are mounted on the lower surface of the third circuit board 24c. A third-board-side second connector (stacking connector or board-to-board connector) 38b constituting the second connector 38 is mounted substantially in the central portion of the lower surface of the third circuit board 24c. The third-board-side second connector 38b has an elongated rectangular shape and is located such that the longitudinal direction thereof corresponds to the width direction of the third circuit board 24c. In addition, the third-board-side second connector 38b is located in a position opposed to the second-board-side second connector 38a of the second circuit board 24b. Accordingly, when the third circuit board 24c is put on the second circuit board 24b, the third-board-side second connector 38b is engaged with the second-board-side second connector 38a to form the second connector 38. In the present embodiment, connectors having dimensions smaller than those of the first connector 36 are used for the second-board-side second connector 38a and the third-board-side second connector 38b constituting the second connector 38.

NAND flash memories 46b serving as memory devices and other semiconductor devices are mounted on the upper surface (second principal surface) of the third circuit board 24c. Through-holes 40c for inserting the screws 22 are formed on the peripheral edge of the third circuit board 24c.

As shown in FIG. 2 to FIG. 5, the first spacer 26a of the circuit board assembly 20 comprises a rectangular spacer frame 50, a support beam 52 extending between a pair of long sides of the spacer frame 50 and coupled to the long sides, and several, for example, three support posts 54 provided in the support beam, which are integrally formed of synthetic resin.

The spacer frame 50 comprises a pair of long-side portions 50a opposed to each other and a pair of short-side portions 50b opposed to each other. The thickness (height) of the spacer frame 50 is substantially equal to the space between the first circuit board 24a and the second circuit board 24b (in the case where the first connector 36 is connected). The spacer frame 50 has approximately the same external dimensions as the first circuit board 24a. Each long-side portion 50a of the spacer frame 50 comprises a tab 51a engageable with the notch 41a of the first circuit board 24a. Through-holes 56a for inserting the screws 22 are formed at several points on the spacer frame 50. Positioning pins (not shown) engageable with the first circuit board 24a are provided at several points on the lower surface of the spacer frame 50.

The support beam 52 of the first spacer 26a functions as a supporting member to support the support posts 54 as a support body. The support beam 52 extends in the width direction of the first circuit board 24a and is formed in the position substantially opposed to the second connector 38 in the side of the first connector 36. The thickness of the support beam 52 is less than that of the spacer frame 50. Accordingly, the support beam 52 is disposed to be opposed with a gap to the first circuit board 24a and the second circuit board 24b. Because of such a gap, components can be mounted on the circuit board even in the position overlapping the support beam 52.

The three support posts 54 are provided orthogonal to the support beam 52 and spaced in the longitudinal direction of the support beam 52. The three support posts 54 are located in a position opposed to the second connector 38 with the second circuit board 24b therebetween. Each support post 54 has approximately the same height as the thickness of the spacer frame 50. The upper and lower ends of each support post 54 can be in contact with the first circuit board 24a and the second circuit board 24b, respectively. The three support posts 54 constitute a supporting member which supports the second connector 38. The support posts 54 are coupled to the spacer frame 50 through the support beam 52 and supported by the support beam 52.

The second spacer 26b of the circuit board assembly 20 comprises a spacer frame 60 obtained by forming synthetic resin into a rectangular frame. The spacer frame 60 comprises a pair of long-side portions 60a opposed to each other and a pair of short-side portions 60b opposed to each other. The thickness (height) of the spacer frame 60 is approximately equal to the space between the second circuit board 24b and the third circuit board 24c (in the case where the second connector 38 is connected). The spacer frame 60 has approximately the same external dimensions as the second circuit board 24b. Each long-side portion 60a of the spacer frame 60 comprises a tab 51b engageable with the notch 41b of the second circuit board 24b. Through-holes 56b for inserting the screws 22 are formed at several points on the spacer frame 60. Positioning pins (not shown) engageable with the second circuit board 24b are provided at several points on the lower surface of the spacer frame 60.

The second spacer 26b may comprise a coupling bead (not shown) for coupling the long-side portions 60a of the spacer frame 60.

The above-described constituent members of the circuit board assembly 20 are sequentially stacked and electrically connected to each other through the first connector 36 and the second connector 38. More specifically, as shown in FIG. 2 to FIG. 5, the first spacer 26a is put on the peripheral edge of the first circuit board 24a and the tabs 51a of the spacer frame 50 are engaged with the notches 41a and the lower surface of the first circuit board 24a. The spacer frame 50 is thereby attached to the first circuit board 24a in a state of being positioned on the peripheral edge of the first circuit board 24a. The second circuit board 24b is put on the first spacer 26a and the second-board-side first connector 36b is engaged with the first-board-side first connector 36a. In this manner, the first circuit board 24a and the second circuit board 24b are electrically and mechanically connected to each other by the first connector 36. The spacer frame 50 of the first spacer 26a is sandwiched between the peripheral edge of the first circuit board 24a and the peripheral edge of the second circuit board 24b and keeps the space between the first and second circuit boards. The support posts 54 of the first spacer 26a are each in contact with the first circuit board 24a and the second circuit board 24b and opposed to the second-board-side second connector 38a.

Figure 6:
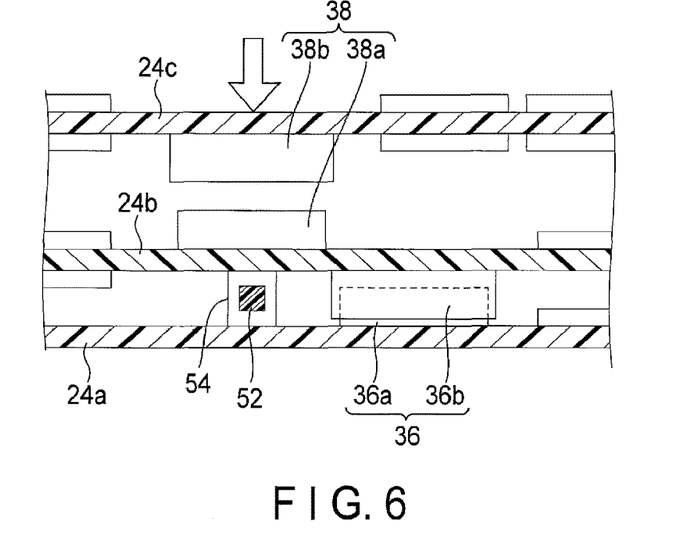
FIG. 6 is a schematic view showing an example of the processing step of the circuit board assembly.

The second spacer 26b is put on the peripheral edge of the second circuit board 24b and the tabs 51b of the spacer frame 60 are engaged with the notches 41b and the lower surface of the second circuit board 24b. The spacer frame 60 is thereby attached to the second circuit board 24b in a state of being positioned on the peripheral edge of the second circuit board 24b. The third circuit board 24c is put on the spacer 26b, and further the third-board-side second connector 38b is pushed and engaged with the second-board-side second connector 38a. Here, as shown in FIG. 6, the support posts 54 are disposed at positions opposed to the second-board-side second connector 38a, and thus the second circuit board 24b and the second-board-side second connector 38a are supported by the support posts 54 from below. With this structure, when the third-board-side second connector 38b is engaged with the second-board-side second connector 38a, the central portions of the second-board-side second connector 38a and the second circuit board 24b are not displaced or distorted towards the first circuit board 24a side, and thus the third-board-side second connector 38b is engaged with and connected to the second-board-side second connector 38a, reliably.

Moreover, when the third-board-side second connector 38b is engaged with the second-board-side second connector 38a, loosening or degradation of engagement of the first connector 36, which may be caused by deformation or distortion of the second circuit board 24b can be prevented. Thus, the first connector 36 can be maintained in a good fit state.

Since the third circuit board 24c is put on the second spacer 26b and the third-board-side second connector 38b is engaged with the second-board-side second connector 38a, the spacer frame 60 of the second spacer 26b is sandwiched between the peripheral edge of the second circuit board 24b and the peripheral edge of the third circuit board 24c and keeps the space between the second and third circuit boards.

As shown in FIG. 2, the circuit board assembly 20 assembled as described above is fixed to the bottom wall 14a of the base 12a by the screws 22 inserted into the through-holes 40c, 56b, 40b, 56a and 40a of the third circuit board 24c, the second spacer 26b, the second circuit board 24b, the first spacer 26a and the first circuit board 24a from the third circuit board 24c side, and the constituent members of the circuit board assembly 20 are thereby clamped to each other.

As shown in FIG. 1 and FIG. 5, the lower surface of the first circuit board 24a of the circuit board assembly 20 fixed to the base 12a is opposed to the bottom wall 14a of the base 12a with narrow space therebetween. The CPU 31 and the NAND flash memories 30a mounted on the first circuit board 24a are in contact with the base 12a through the heat-sink sheets 18a. Of the first circuit board 24a, the back surface of a portion equipped with the first connector 36 is in contact with the projections (bosses) 19 of the bottom wall 14a through the heat-sink sheet 18a.

The third circuit board 24c of the circuit board assembly 20 is opposed to the top plate 15a of the cover 12b with narrow space therebetween. The NAND flash memories 46b mounted on the third circuit board 24c are in contact with the recesses 17a of the top plate 15a through the heat-sink sheets 18b. Of the third circuit board 24c, the back surface of a portion equipped with the second connector 38 is in contact with the recesses 17a of the top plate 15a through the heat-sink sheets 18b.

The interface connector 32 mounted on the first circuit board 24a is exposed to the outside through an opening of the enclosure 12.

According to the first embodiment configured as described above, a high-capacity SSD can be realized by using the circuit board assembly in which three circuit boards are stacked. Moreover, since the first connector 36 and the second connector 38 are offset with respect to each other in the surface direction of the circuit board, flexibility in connection between the connectors and interconnects on the circuit boards can be improved and the interconnects can be easily routed and connected. Further, since the spacer comprising a supporting member for supporting connectors is provided between the circuit boards, the connectors can be prevented from being imperfectly engaged and the ease of assembly and the reliability can be improved. Moreover, the supporting mechanism of the connectors can be realized at low cost by integrating the supporting member as a part of the spacer.

Since a portion of the circuit board assembly 20 comprising the first and second connectors 36 and 38 is supported by the recesses 17a, the heat-sink sheets 18b, the bosses 19 and the heat-sink sheets 18a, from both sides of the base 12a side and the cover 12b of the enclosure 12, the first and second connectors 36 and 38 can be kept securely engaged with each other and the shock resistance of the SSD can be improved.

Next, a spacer and a circuit board assembly of an SSD according to a modification will be described. In the modification described below, elements equivalent to those of the first embodiment are represented by the same reference numbers and their detailed description is omitted. Mainly, the differences from the first embodiment are described in detail.

First Modification

Figure 7:
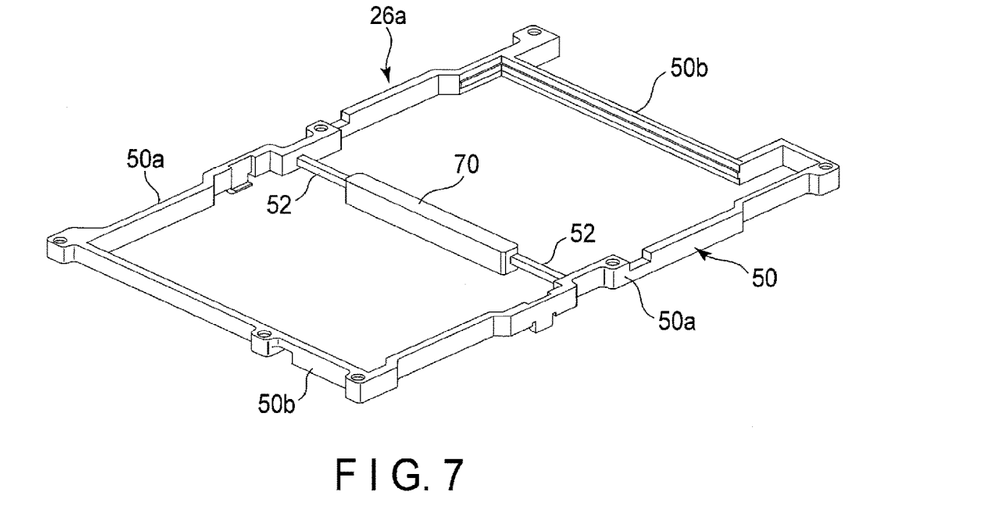
FIG. 7 is a perspective view showing a spacer frame of a storage device of a first modification.

FIG. 7 is a perspective view showing a first spacer of an SSD according to the first modification. According to the first modification, a supporting member of a first spacer 26a is a pillar rod 70 having substantially the same length as a second connector 38. The pillar rod 70 is provided in the width direction of the spacer frame 50 and both ends thereof are coupled to the spacer frame 50 through the support beam 52. The pillar rod 70 is formed to have substantially the same size (thickness) as the thickness (height) of the spacer frame 50, and the upper surface and the lower surface of the pillar rod 70 are in contact with the upper and lower circuit boards, respectively.

Second Modification

Figure 8:
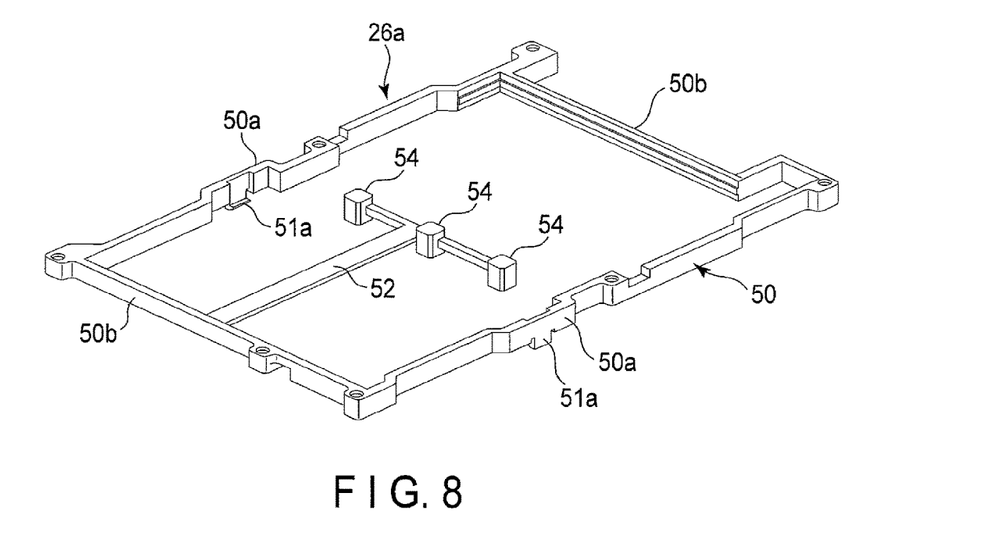
FIG. 8 is a perspective view showing a spacer frame of a storage device of a second modification.

FIG. 8 is a perspective view showing a first spacer of an SSD according to the second modification. According to the second modification, a support beam 52 of the first spacer 26a has a T-shape, and is connected to a short-side portion 50b of the spacer frame 50. The support body comprises a plurality (for example, three) of support posts 54. These support posts 54 are integrally provided in a free end portion of the support beam 52. The three support posts 54 are arranged in positions opposed to the second connector 38.

When the first spacer of the first modification or the first spacer of the second modification described above is used, an advantage according to the first embodiment can be obtained. Note that the shape of the support body is not limited to those of the embodiment and modifications described above, but the member can be formed into other shapes as needed. The number of support bodies is not limited to one or three, but can be increased or decreased as needed.

Third Modification

Figure 9:
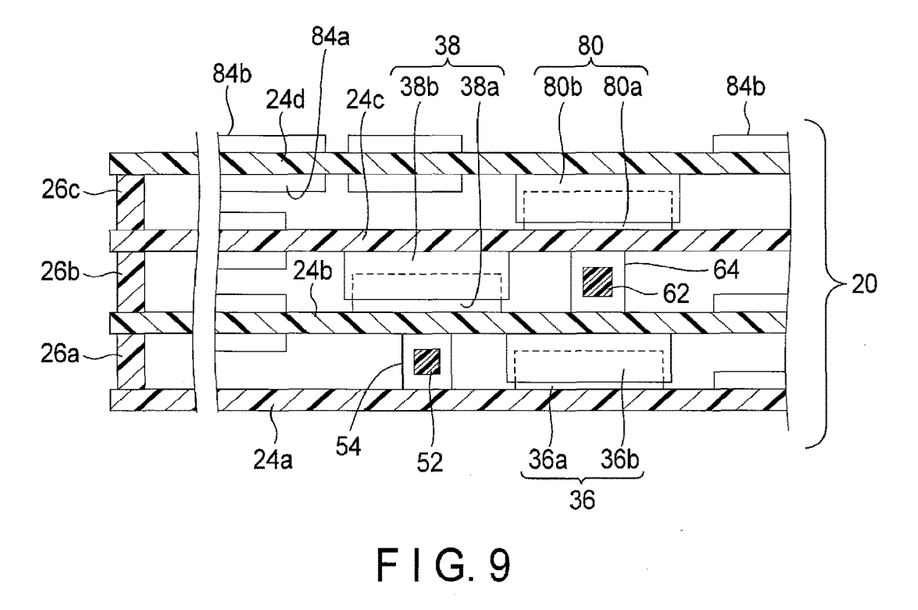
FIG. 9 is a cross-sectional view briefly showing a circuit board assembly of a storage device of a third modification.

FIG. 9 is a sectional view showing the circuit board assembly of according to SSD in the third modification briefly. According to the third modification, the circuit board assembly 20 further comprises a fourth circuit board 24d disposed above a third circuit board 24c, a frame-shaped third spacer 26c sandwiched between the third circuit board 24c and the fourth circuit board 24d and a third connector 80 which electrically and mechanically connects the third circuit board 24c to the fourth circuit board 24d.

The third connector 80 is constituted by a third-board-side third connector 80a mounted on an upper surface of the third circuit board 24c, and a fourth-board-side third connector 80b mounted on a lower surface of the fourth circuit board 24d. The third connector 80 is provided to be offset with respect to the second connector 38 in the plane direction of the third circuit board 24c. Memory devices, for example, NAND flash memories 84a and 84b are mounted on the lower surface and the upper surface of the fourth circuit board 24, respectively.

The second spacer 26b sandwiched between the second circuit board 24b and the third circuit board 24c integrally comprises a support post 64 as a support body, formed in a position opposed to the third connector 80 and a support beam 62 that connects the support post 64 to the spacer frame of the second spacer 26b. The support post 64 is in contact with the upper surface of the second circuit board 24b and the lower surface of the third circuit board 24c, to support the third connector 80.

According to the third modification configured as above, a larger-capacity storage device can be realize by increasing the number of circuit boards. Further, by supporting the third connector 80 offset with respect to the second connector 38 with the support post 64 of the second spacer 26b, an engagement error of the third connector 80 can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   an enclosure; and
   a circuit board assembly accommodated in the enclosure, the circuit board assembly comprising:
   a first circuit board on which a memory device is mounted,
   a second circuit board opposed to the first circuit board, on which a memory device is mounted,
   a third circuit board opposed to the second circuit board, on which a memory device is mounted,
   a first board-to-board connector provided between the first circuit board and the second circuit board, to connect the first circuit board and the second circuit board to each other,
   a second board-to-board connector provided between the second circuit board and the third circuit board to connect the second circuit board and the third circuit board to each other, and shifted with respect to the first board-to-board connector in a plane direction of the second circuit board,
   a frame-shaped first spacer sandwiched between the first circuit board and the second circuit board, and a frame-shaped second spacer sandwiched between the second circuit board and the third circuit board, the first spacer comprising a support body provided at a position opposed to the second board-to-board connector and brought into contact with the first circuit board and the second circuit board.

2. The storage device of claim 1, wherein the first spacer comprises a spacer frame sandwiched between a peripheral portion of the first circuit board and a peripheral portion of the second circuit board and the support body is coupled to the spacer frame.

3. The storage device of claim 2, wherein the first spacer comprises a support member connected to at least one side part of the spacer frame, and the support body is formed integrally with the support member.

4. The storage device of claim 3, wherein the support body comprises a plurality of support posts formed integrally with the support member.

5. The storage device of claim 3, wherein the support member includes a support beam connected to two side portions of the spacer frame, opposed to each other.

6. The storage device of claim 3, wherein the support member is a support beam having a thickness less than a gap between the first circuit board and the second circuit board, and the support beam is opposed to the first circuit board and the second circuit board across a gap.

7. The storage device of claim 1, wherein the first board-to-board connector comprises a first-board-side first connector mounted on the first circuit board, and a second-board-side first connector mounted on the second circuit board and mated with the first-board-side first connector, and the second board-to-board connector comprises a second-board-side second connector mounted on the second circuit board at a position shifted with respect to the second-board-side first connector in a plane direction of the second circuit board, and a third-board-side second connector mounted on the third circuit board and mated with the second board-side second connector.

8. The storage device of claim 7, wherein the second board-to-board connector has dimensions smaller than those of the first board-to-board connector.

9. The storage device of claim 1, wherein the enclosure comprises a first wall opposed to the first circuit board of the circuit board assembly, and a second wall opposed to the third circuit board of the circuit board assembly, the first wall including a projection brought into contact with the first circuit board at a position opposed to the first board-to-board connector of the circuit board assembly and the second wall including a projection brought into contact with the third circuit board at a position opposed to the second board-to-board connector of the circuit board assembly.

10. The storage device of claim 9, wherein the enclosure comprises a heat-sink sheet provided between the projection of the first wall and the first circuit board, and a heat-sink sheet provided between the projection of the second wall and the third circuit board.

11. The storage device of claim 1, wherein the circuit board assembly further comprises a fourth circuit board on which a memory device is mounted, opposed to the third circuit board, a third board-to-board connector provided between the third circuit board and the fourth circuit board to connect the third circuit board and the fourth circuit board to each other, and disposed to be shifted in a plane direction of the third circuit board with respect to the second board-to-board connector, and a frame-shaped third spacer sandwiched between the third circuit board and the fourth circuit board, and the second spacer comprises a support body provided at a position opposed to the third board-to-board connector and brought into contact with the second circuit board and the third circuit board.

* * * * *